(12) United States Patent
Liu et al.

(10) Patent No.: US 11,934,690 B2
(45) Date of Patent: *Mar. 19, 2024

(54) MEMORY SUB-SYSTEM REFRESH

(71) Applicant: Micron Technology, Inc., Boise, ID (US)

(72) Inventors: Tao Liu, San Jose, CA (US); Ting Luo, Santa Clara, CA (US); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/105,043

(22) Filed: Feb. 2, 2023

(65) Prior Publication Data

US 2023/0185479 A1 Jun. 15, 2023

Related U.S. Application Data

(63) Continuation of application No. 17/244,290, filed on Apr. 29, 2021, now Pat. No. 11,579,797.

(51) Int. Cl.
*G11C 16/34* (2006.01)
*G06F 3/06* (2006.01)

(52) U.S. Cl.
CPC .......... *G06F 3/0655* (2013.01); *G06F 3/0604* (2013.01); *G06F 3/0679* (2013.01); *G11C 16/349* (2013.01)

(58) Field of Classification Search
CPC ...... G06F 3/0655; G06F 3/0604; G06F 3/067; G11C 16/349

(Continued)

(56) References Cited

U.S. PATENT DOCUMENTS

2004/0213035 A1 10/2004 Cavaleri et al.
2007/0002656 A1\* 1/2007 An .......................... G11C 29/12
365/222

(Continued)

FOREIGN PATENT DOCUMENTS

EP 481759 A \* 4/1992 .......... G06F 11/1008
EP 1267354 A2 \* 12/2002 .......... G11C 11/406

(Continued)

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

*Primary Examiner* — Michael T Tran
(74) *Attorney, Agent, or Firm* — Brooks, Cameron & Huebsch, PLLC

(57) ABSTRACT

A method includes determining a first memory access count threshold for a first word line of a block of memory cells and determining a second memory access count threshold for a second word line of the block of memory cells. The second memory access count threshold can be greater than the first memory access count threshold. The method can further include incrementing a memory block access count corresponding to the block of memory cells that includes the first word line and the second word line in response to receiving a memory access command and refreshing the first word line when the memory block access count corresponding to the block of memory cells is equal to the first memory access count threshold.

19 Claims, 5 Drawing Sheets

(58) Field of Classification Search
USPC .................................... 365/185.24, 185.25
See application file for complete search history.

(56) References Cited

U.S. PATENT DOCUMENTS

| | | | |
|---|---|---|---|
| 2007/0183242 A1* | 8/2007 | Miyamoto | G11C 11/22 |
| | | | 365/222 |
| 2007/0230264 A1* | 10/2007 | Eto | G11C 11/406 |
| | | | 365/222 |
| 2008/0253212 A1 | 10/2008 | Iida et al. | |
| 2010/0077132 A1* | 3/2010 | Hung | G11C 16/349 |
| | | | 711/E12.008 |
| 2010/0182863 A1* | 7/2010 | Fukiage | G11C 11/40618 |
| | | | 365/230.03 |
| 2010/0208537 A1* | 8/2010 | Pelley, III | G11C 11/40622 |
| | | | 365/201 |
| 2011/0216612 A1 | 9/2011 | Ishikawa | |
| 2013/0250711 A1* | 9/2013 | Shiah | G11C 11/40603 |
| | | | 365/222 |
| 2014/0108705 A1* | 4/2014 | Gorobets | G11C 11/5628 |
| | | | 711/103 |
| 2014/0231954 A1 | 8/2014 | Lue | |
| 2014/0355332 A1* | 12/2014 | Youn | G11C 11/40611 |
| | | | 365/149 |
| 2015/0155030 A1 | 6/2015 | Song et al. | |
| 2015/0199234 A1* | 7/2015 | Choi | G11C 29/4401 |
| | | | 714/764 |
| 2015/0235694 A1* | 8/2015 | Kim | G11C 11/40626 |
| | | | 365/222 |
| 2015/0339188 A1* | 11/2015 | Hu | G06F 11/3034 |
| | | | 714/704 |
| 2016/0163393 A1* | 6/2016 | Liang | G11C 16/349 |
| | | | 365/185.11 |
| 2016/0179386 A1 | 6/2016 | Zhang | |
| 2017/0132125 A1* | 5/2017 | Cai | G06F 12/0261 |
| 2017/0186481 A1* | 6/2017 | Oh | G11C 11/406 |
| 2017/0329542 A1* | 11/2017 | Chou | G06F 3/0619 |
| 2019/0189193 A1 | 6/2019 | Kim | |
| 2019/0294358 A1 | 9/2019 | Suzuki et al. | |
| 2019/0325944 A1* | 10/2019 | Nakaoka | G06F 3/0659 |
| 2019/0348103 A1 | 11/2019 | Jeong et al. | |
| 2019/0354311 A1* | 11/2019 | Ji | G06F 3/0658 |
| 2020/0251158 A1* | 8/2020 | Shore | G11C 11/407 |
| 2021/0020223 A1 | 1/2021 | Ayyapureddi et al. | |
| 2021/0118491 A1 | 4/2021 | Li et al. | |
| 2021/0124529 A1* | 4/2021 | Nishikawa | G06F 3/0659 |
| 2021/0133095 A1* | 5/2021 | Kim | G06F 12/0871 |
| 2021/0208790 A1* | 7/2021 | Peterson | G06F 3/065 |
| 2021/0208792 A1* | 7/2021 | Peterson | G06F 12/122 |
| 2021/0358546 A1 | 11/2021 | Sinipete et al. | |
| 2021/0375348 A1 | 12/2021 | Lee et al. | |
| 2022/0069992 A1 | 3/2022 | Ayyapureddi | |
| 2022/0100668 A1* | 3/2022 | Blagodurov | G06F 12/0815 |
| 2022/0165347 A1* | 5/2022 | Pan | G11C 7/065 |
| 2022/0199141 A1 | 6/2022 | Arai | |

FOREIGN PATENT DOCUMENTS

| | | | | |
|---|---|---|---|---|
| EP | 1840900 A1 | * | 10/2007 | ........... G11C 11/406 |
| JP | 2010170596 A | * | 8/2010 | ........... G11C 11/406 |
| JP | 2012064304 A | | 3/2012 | ........... G11C 11/406 |
| WO | 2017074570 A1 | | 5/2017 | |

* cited by examiner

MEMORY SUB-SYSTEM REFRESH

PRIORITY INFORMATION

This application is a Continuation of U.S. application Ser. No. 17/244,290, filed Apr. 29, 2021, the contents of which are included herein by reference.

TECHNICAL FIELD

Embodiments of the disclosure relate generally to memory sub-systems, and more specifically, relate to memory sub-system refresh.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
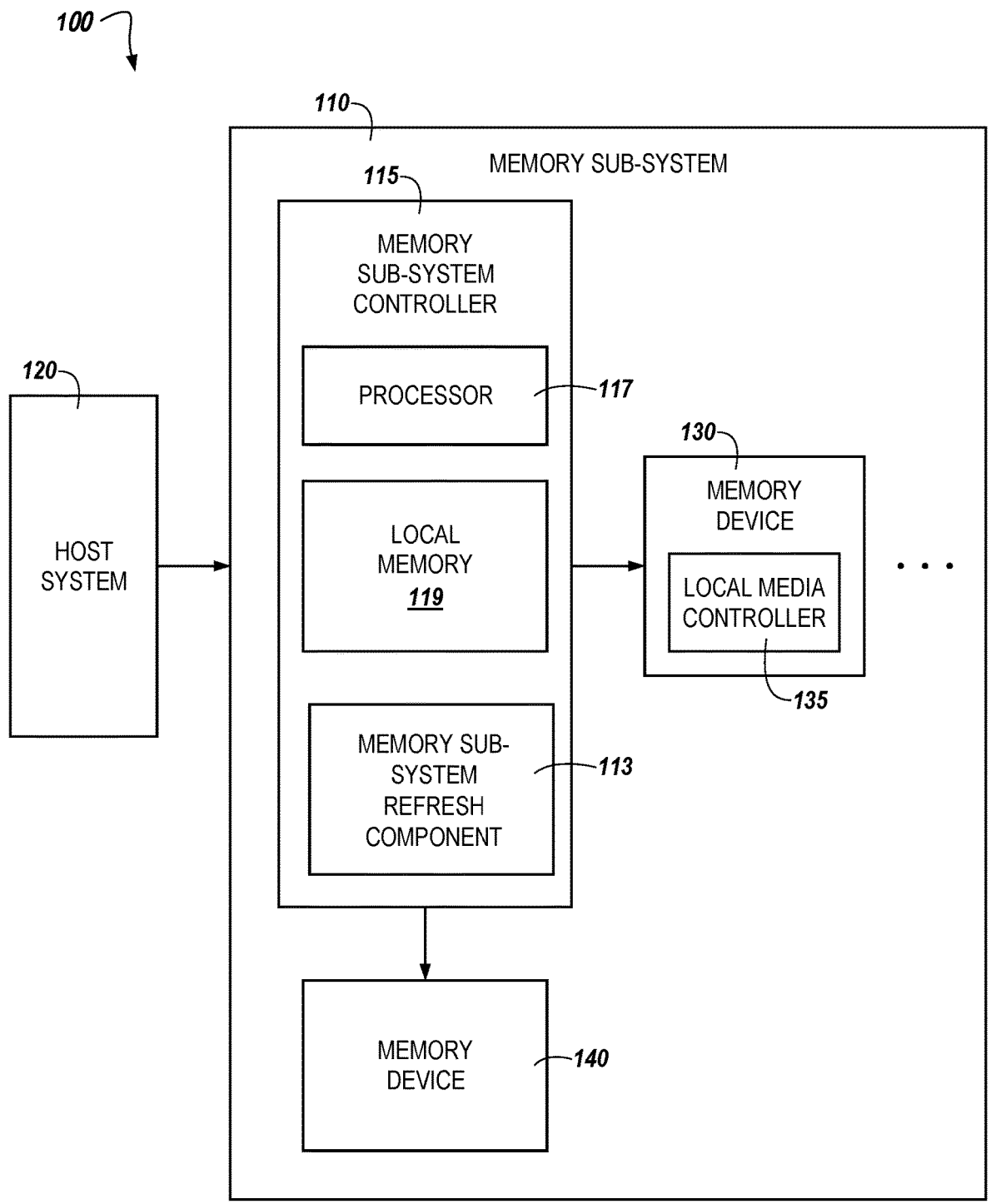
FIG. 1 illustrates an example computing system that includes a memory sub-system in accordance with some embodiments of the present disclosure.

Aspects of the present disclosure are directed to memory sub-system refresh, in particular to memory sub-systems that include a memory sub-system refresh component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks" and/or "blocks of memory cells") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

During operation a memory sub-system will execute a number of memory access commands (e.g., read commands). Voltage levels shifts can occur as the number of memory access commands increase. These voltage level shifts can eventually result in errors (e.g., read errors).

NAND characterization data, which may be determined and/or assigned by a NAND manufacturer for instance, may include a block memory access threshold (e.g., a block read count threshold). The block memory access threshold can be associated with a poorest performing word line, (e.g., the poorest performing word line of a block and/or number of blocks). Previous refresh operations have utilized the block memory access threshold associated with a poorest performing word line; for instance when a block has a number of memory accesses, (e.g., reads) equal to the block memory access threshold associated with a poorest performing word line, then the entire block is refreshed. While the poorest performing word line may need refreshing upon the block having a number of memory accesses equal to the block memory access threshold associated with a poorest performing word line, other word lines, (e.g., better performing word lines having improved NAND characterization data as compared to the poorest performing word line) will not need refreshing. Refreshing an entire block of memory cells based upon a poorest performing word line may be referred to as "over-refreshing." Over-refreshing consumes system resources and may cause elevated erase amplification, thus reducing system performance and reducing device life expectancy. Therefore it may be desirable to decrease over-refreshing.

Aspects of the present disclosure address the above and other deficiencies by utilizing a first memory access count threshold and a second memory access count threshold. The first memory access count threshold corresponds to a first word line of a block of memory cells and the second memory access count threshold corresponds to a second word line (or word lines) of the block of memory cells.

Embodiments of the present disclosure provide that the second memory access count threshold is greater than the first memory access count threshold. In addition, embodiments of the present disclosure can allow for individual word lines (e.g., word lines having a poorer performance than other word lines) to be refreshed in the absence of performance of a block refresh operation in which all word lines of a particular block are refreshed.

As a memory block access count is incremented in response to receiving an access command, the memory block access count is compared to the first memory access count threshold. If the memory block access count is equal to the first memory access count threshold, then the first word line is refreshed. Embodiments are not so limited, however, and in some embodiments, the first word line can be refreshed when the memory block access count is less than, but near, the first memory access count threshold. For example, if the first memory access count threshold is X, the first word line can be refreshed when the first memory block access count is equal to X−1, X−2, etc. In some embodiments, when the first word line is refreshed, other word lines of the block of memory cells, (e.g., a second word line or word lines), are not refreshed, thereby reducing over-refreshing. As a memory block access count is further incremented in response to receiving an access command, the memory block access count is compared to the second access count threshold. If the memory block access count is equal to the second access count threshold, then the second word line is refreshed. Embodiments are not so limited, however, and in some embodiments, the second word line can be refreshed when the memory block access count is less than, but near, the second memory access count threshold. For example, if the second memory access count threshold is Y, the first word line can be refreshed when the first memory block access count is equal to Y−1, Y−2, etc. One or more embodiments provide that the memory block access count can be reset when the memory block access count is equal to (or less than, but near, the memory block access count, as described above) the second access count threshold, (e.g., upon refreshing the second word line) and/or when the entire block is refreshed.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a memory sub-system refresh component 113, which can be referred to herein for brevity as a "refresh component 113." Although not shown in FIG. 1 so as to not obfuscate the drawings, the refresh component 113 can include various circuitry to facilitate incrementing a memory block access count corresponding to a block of memory cells that includes the first word line (e.g., the word line 382 illustrated in FIG. 3, herein) and the second word line (e.g., the word line 383 illustrated in FIG. 3, herein) for a memory sub-system and/or components of the memory sub-system, refreshing the first word line when the memory block access count corresponding to the block of memory cells is equal to the first memory access count threshold for the memory sub-system and/or components of the memory sub-system, and refreshing the second word line when the memory block access count corresponding to the block of memory cells is equal to the second memory access count threshold. In some embodiments, the refresh component 113 can include special purpose circuitry in the form of an ASIC, FPGA, state machine, and/or other logic circuitry that can allow the refresh component 113 to orchestrate and/or perform operations to selectively refresh operations for the memory device 130 and/or the memory device 140 based on memory access counts.

In some embodiments, the memory sub-system controller 115 includes at least a portion of the refresh component 113. For example, the memory sub-system controller 115 can include a processor 117 (processing device) configured to execute instructions stored in local memory 119 for performing the operations described herein. In some embodiments, the refresh component 113 is part of the host system 110, an application, or an operating system.

In a non-limiting example, an apparatus (e.g., the computing system 100) can include a memory sub-system refresh component 113. The memory sub-system refresh component 113 can be resident on the memory sub-system 110. As used herein, the term "resident on" refers to something that is physically located on a particular component. For example, the memory sub-system refresh component 113 being "resident on" the memory sub-system 110 refers to a condition in which the hardware circuitry that comprises the memory sub-system thermal throttling component 113 is physically located on the memory sub-system 110. The term "resident on" can be used interchangeably with other terms such as "deployed on" or "located on," herein.

The memory sub-system refresh component 113 can increment a memory block access count corresponding to a block of memory cells (e.g., the memory block 380/381 illustrated in FIG. 3, herein) in response to receiving a memory access command, and refresh a first word line when the memory block access count corresponding to the block of memory cells is equal to a first memory access count threshold, and refresh a second word line when the memory block access count corresponding to the block of memory cells is equal to a second memory access count threshold In some embodiments, the second memory access count threshold is greater than the first memory access count threshold. As described above, the memory components can be memory dice or memory packages that form at least a portion of the memory device 130.

The memory sub-system thermal refresh component 113 can refresh the first word line when the memory access count corresponding to the block of memory cells is equal to (or less than, but near) the first memory access count threshold by copying data from a first word line to a word line that is different than the first word line and the second word line. In some embodiments, the data copied from the first word line to the word line that is different than the first word line and the second word line is not erased from the first word line prior to the second word line being refreshed. In some embodiments, the word line that is different than the first word line and the second word line is within a different block of memory cells (e.g., if the first word line and the second word line are in the memory block 380 illustrated in FIG. 3, the word line that is different can be in the memory block 381 illustrated in FIG. 3, or vice versa); however, embodiments are not so limited. For instance, in some embodiments, the word line that is different than the first word line and the second word line is within the block of memory cells that includes the previously mentioned first word line and second word line (e.g., the first word line, the second word line, and the word line that is different than the first and second word line can be in the memory block 380 illustrated in FIG. 3).

In some embodiments, the memory sub-system refresh component 113 can reset the memory access count corresponding to the block of memory cells when the memory access count corresponding to the block of memory cells is equal to the second memory access count threshold. Further, in some embodiments, the memory sub-system refresh component 113 can erase the block of memory cells when the memory access count corresponding to the block of memory cells is equal to (or less than, but near) the second memory access count threshold. Additionally, in some embodiments, the memory sub-system refresh component 113 can perform a program operation to write data to the block of memory cells.

In another non-limiting example, a system (e.g., the computing system 100) can include a memory sub-system 110 comprising memory components arranged to form a stackable cross-gridded array of memory cells (e.g., a three-dimensional NAND array). A processing device (e.g., the refresh component 113, the processor 117, and/or the local media controller 135) can be coupled to the memory components and can determine a first memory access count threshold for a first word line of a block of memory cells and determine a second memory access count threshold for a second word line of the block of memory cells. In some embodiments, the second memory access count threshold is greater than the first memory access count threshold. The processing device can increment a memory block access count corresponding to a block of memory cells that includes the first word line and the second word line in response to receiving a memory access command and refresh the first word line when the memory block access count corresponding to the block of memory cells is equal to the first memory access count threshold.

The memory sub-system refresh component 113 can refrain from refreshing the first word line when the memory block access count corresponding to the block of memory cells is less than the first memory access count threshold. The memory sub-system refresh component 113 can refrain from refreshing the second word line when the memory block access count corresponding to the block of memory cells is less than the second memory access count threshold. This (e.g., refraining from refreshing the second word line when the memory block access count corresponding to the block of memory cells is less than the second memory access count threshold) can help provide for a decrease of over-refreshing because the entire block of memory cells is not refreshed when the first memory access count threshold is met and/or when the first word line is refreshed.

Figure 2:
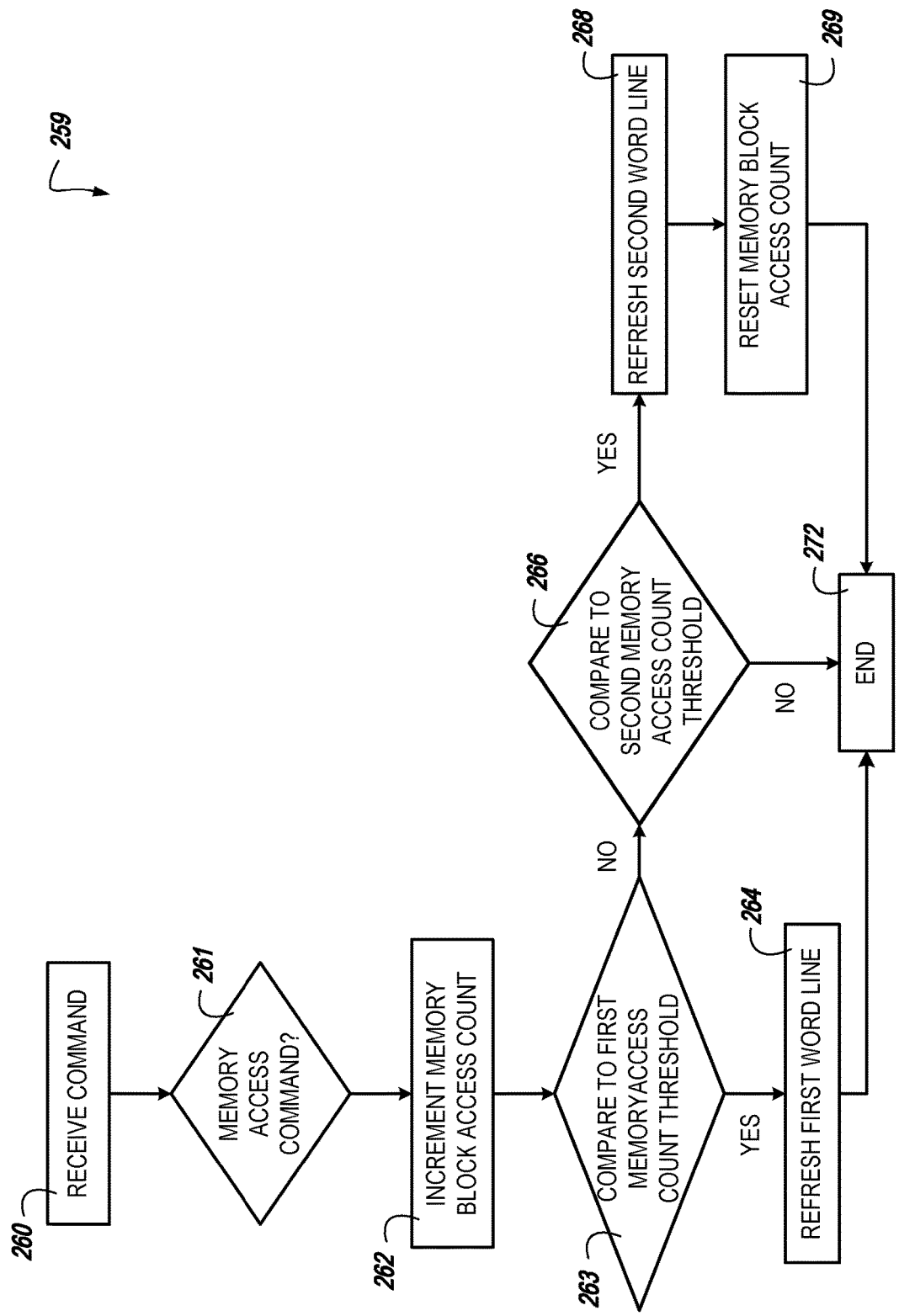
FIG. 2 is a flow diagram corresponding to memory sub-system temperature refresh in accordance with some embodiments of the present disclosure.

FIG. 2 is a flow diagram 259 corresponding to memory sub-system refresh control in accordance with some embodiments of the present disclosure. The flow 259 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the flow 259 is performed by the refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 260, a command is received. As an example, the command may be received from a host system (e.g., host system 120 shown in FIG. 1). At operation 261, a determination can be made as whether the received command is a memory access command (e.g., a read command). If the received command is determined to be other than a memory access command, one or more operations associated with the other than a memory access command may be performed. However, if the received command is determined to a memory access command at operation 261, then the flow diagram 259 proceeds to the following operation. The memory access command can be associated with a memory location (e.g., a memory address). For instance, the memory access command can be associated with a particular block of memory cells and a particular word line within the block of memory cells.

At operation 262, a memory block access count is incremented. The memory block access count is incremented in response to the received command being a memory access command, which is associated with a block of memory cells and a word line within the block of memory cells. The memory block access count is incremented from a preceding value of the memory block access count.

At operation 263, the incremented memory block access count is compared to a first memory access count threshold. As used herein, a "memory access count threshold" refers to value at which a portion of memory associated therewith is to be refreshed. The memory access count threshold can be based on a quantity of memory accesses (e.g., read operations, write operations, erase operations, etc.) that have occurred involving at least a portion of the memory array (e.g., a quantity of word lines of a memory device). One or more embodiments provide that a memory access count threshold may be assigned by a manufacturer (e.g., a manufacturer of one or more of the memory components discussed herein) and/or at a testing stage of the memory prior to sale, for instance. A memory access count threshold may be determined (e.g., in preparation for assignment by a manufacturer) by one or more diagnostic procedures. Embodiments provide that different diagnostic procedures may be utilized for various applications.

One or more embodiments provide that multiple memory access count thresholds can be determined and assigned for each particular block of memory cells. For instance, the first memory access count threshold can be associated with one or more word lines of a particular block of memory cells, where these one or more word lines have a poorer performance (e.g., as determined by one or more diagnostic procedures), as compared to a number of other word lines of the particular block of memory cells. Additionally, a second memory access count threshold can be associated with one or more word lines of a particular block of memory cells, where these one or more word lines have an improved performance (e.g., as determined by one or more diagnostic procedures), as compared to the one or more word lines associated with the first memory access count threshold. In other words, the second memory access count threshold is greater than the first memory access count threshold in some embodiments. Memory access count thresholds can have various values for different applications.

If the memory block access count is compared to the first memory access count threshold, and the memory block access count is equal to (or less than, but near to, as described above) the first memory access count threshold the flow 259 proceeds to operation 264. At operation 264, the first word line is refreshed. One or more embodiments provide that refreshing the first word line can include copying data from the first word line to a word line that is different than the first word line. Additionally, one or more embodiments provide that when the data is copied from the first word line to the word line that is different than the first word line (e.g., the first word line is refreshed), the data is not erased from the first word line due to the first word line being refreshed; however, embodiments are not so limited.

If the memory block access count is compared to the first memory access count threshold, and the memory block access count is not equal to the first memory access count threshold (e.g., the memory block access count is different than the first memory access count threshold) the flow 259 proceeds to operation 266.

At operation 266, the memory block access count is compared to a second memory access count threshold. The second memory access count threshold may be associated with one or more word lines of a particular block of memory cells, where these one or more word lines have an improved performance (e.g., as determined by one or more diagnostic procedures), as compared to a number of other word lines of the particular block of memory cells. Embodiments provide that the second memory access count threshold is greater than the first memory access count threshold.

If the memory block access count compared (at operation 266) to the second memory access count threshold, and the memory block access count is not equal to the second memory access count threshold (e.g., the memory block access count is less than the second memory access count threshold) the flow 259 proceeds to operation 272. At operation 272, the flow 259 is ended until another a command is received at operation 260 and then the flow 259 again proceeds as discussed herein.

If the memory block access count is compared (at operation 266) to the second memory access count threshold, and the memory block access count is equal to (or less than, but near to, as described above) the second memory access count threshold the flow 259 proceeds to operation 268.

At operation 268, the second word line is refreshed. One or more embodiments provide that refreshing the second word line and include copying data from the second word line to a word line that is different than the second word line.

As shown in FIG. 2, subsequently to refreshing the second word line at operation 268, the memory block access count is reset at operation 269. Embodiments provide that the memory block access count is reset to a value that is less than the first memory access count threshold. For instance, the memory block access count may be reset to a value of zero.

At operation 272, after the memory block access count is reset at operation 269, the flow 259 is ended until another a command is received at operation 260 and then the flow 259 again proceeds as discussed herein.

Figure 3:
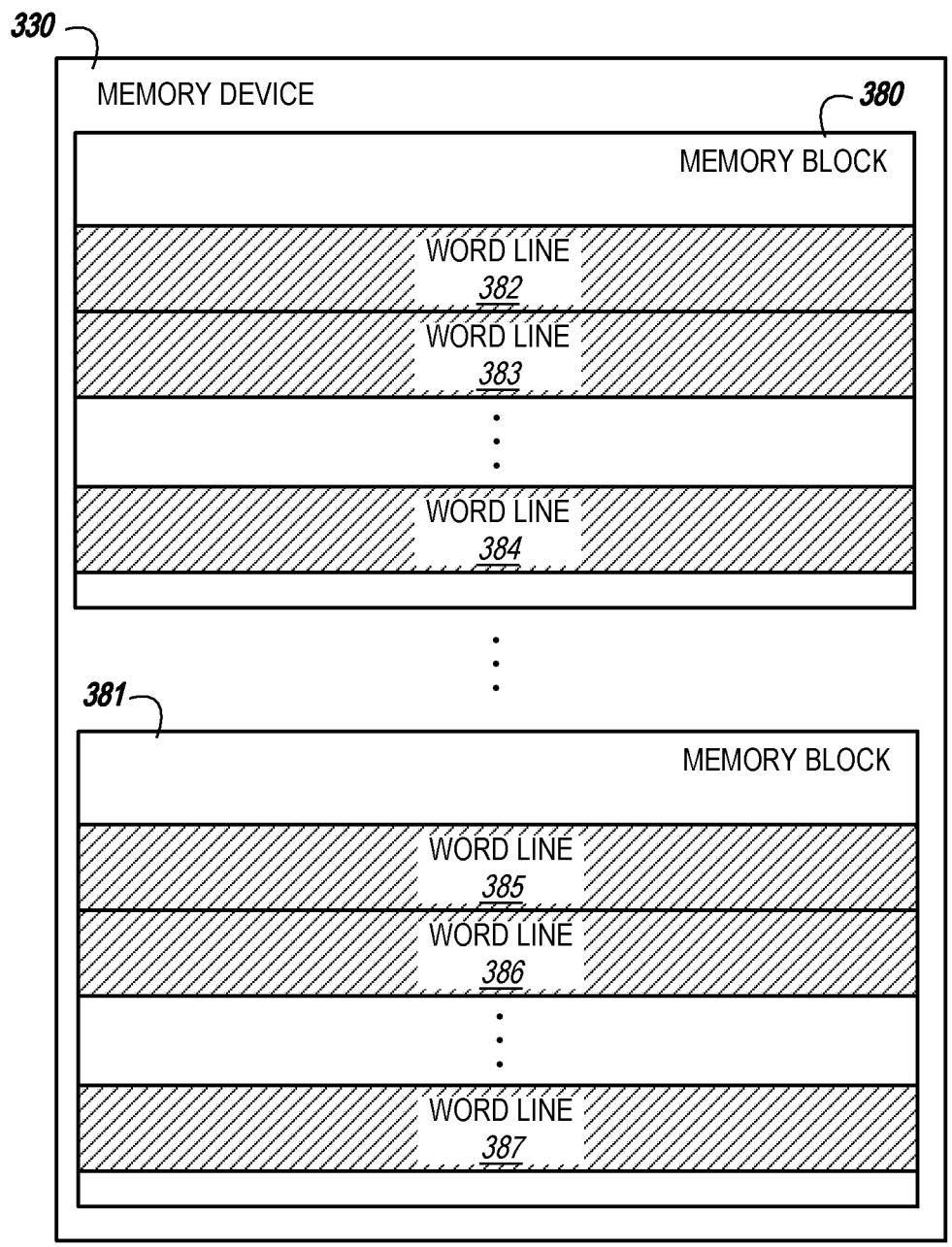
FIG. 3 illustrates an example of a portion of a memory device according to one or more embodiments of the present disclosure.

FIG. 3 illustrates an example of a portion of a memory device 330 according to one or more embodiments of the present disclosure. As shown in FIG. 3, the memory device 330 includes multiple blocks of memory cells. As shown in FIG. 3 the memory device 330 incudes a first block of memory cells 380 and a second block of memory cells 381; however, embodiments are not so limited and the memory device 330 may include additional blocks of memory cells not illustrated in FIG. 3.

The first block of memory cells 380 includes multiple word lines. As shown in FIG. 3 the first block of memory cells 380 incudes word line 382, word line 383 and word line 384; however, embodiments are not so limited and the first block of memory cells 380 can include additional word lines not illustrated in FIG. 3. The second block of memory cells 381 includes multiple word lines. As shown in FIG. 3 the second block of memory cells 381 incudes word line 385, word line 386 and word line 387; however, embodiments are not so limited and the second block of memory cells 381 can include additional word lines not illustrated in FIG. 3.

A memory access count threshold may be determined (e.g., in preparation for assignment by a manufacturer) by one or more diagnostic procedures and multiple memory access count thresholds may be determined and assigned for each particular block of memory cells 380/381. Each particular block of memory cells 380/381 of the memory device 330 can have a first memory access count threshold and a second memory access count threshold. Some embodiments provide that the first memory access count threshold and the second memory access count threshold are based at least in part on read disturb characterizations of a first word line or a second word line of a block of memory cells 380/381. For instance, the first block of memory cells 380 can have a first memory access count threshold and a second memory access count threshold. The first memory access count threshold has a poorer performance (e.g., as determined by one or more diagnostic procedures), as compared to a number of other word lines of block of memory cells 380. As an example, the first memory access count threshold can correspond to word line 382 of block 380. The word line associated with the second memory access count threshold has an improved performance (e.g., as determined by one or more diagnostic procedures), as compared to one or more other word lines of block of memory cells 380. As an example, the second memory access count threshold may correspond to word line 383 of block 380. As mentioned, the second memory access count threshold is greater than the first memory access count threshold.

When a memory block access count associated with block of memory cells 380 is equal to (or less than, but near to, as described above) the first memory access count threshold, the word line associated with the first memory access count threshold is refreshed. In this example, as mentioned, the first memory access count threshold is associated with word line 382; as such word line 382 is refreshed. When a memory block access count associated with block of memory cells 380 is less than the first memory access count threshold, refreshing the word line associated with the first memory access count threshold is refrained from until the memory block access count is incremented to be equal to (or less than, but near to, as described above) the first memory access count threshold.

Refreshing the word line 382 can include copying data from the word line 382 to a different word line. For instance, refreshing the word line 382 can include copying data from the word line 382 to a different word line in the same block of memory cells (i.e., the block of memory cells 380), such as word line 384. However, embodiments are not so limited. For example, refreshing the word line 382 can include copying data from the word line 382 to a different block of memory cells (e.g., the block of memory cells 381). For instance, data may be copied from the word line 382 to the word line 387 of the block of memory cells 381. One or more embodiments provide that the data copied from word line 382 to a different word line is not erased from the word line 382 prior to the memory block access count being equal to (or less than, but near to, as described above) the second memory access count threshold (e.g., such that the word line having improved performance as compared to the word line associated with the first memory access count threshold is refreshed).

When a memory block access count associated with the block of memory cells 380 is equal to the second memory access count threshold, the word line associated with the second memory access count threshold is refreshed. In this example, as mentioned, the second memory access count threshold is associated with the word line 383; as such the word line 383 is refreshed. Further, when a memory block access count associated with the block of memory cells 380 is equal to (or less than, but near to, as described above) the second memory access count threshold other word lines of the block of the memory cells 380 can also be refreshed (e.g., when a memory block access count associated with a block of memory cells is equal to the second memory access count threshold each word line of that block of memory cells can be refreshed). Refreshing the word line 383 can include copying data from the word line 383 to a different word line. For example, refreshing the word line 383 can include copying data from the word line 383 to a different block of memory cells (e.g., block of memory cells 381). When a memory block access count associated with the block of memory cells 380 is less than the second memory access count threshold, refreshing the word line associated with the second memory access count threshold is refrained from until the memory block access count is incremented to be equal to (or less than, but near to, as described above) the second memory access count threshold.

Some embodiments provide that when a memory block access count associated with the block of memory cells 380 is equal to the second memory access count threshold, the block of memory cells can be erased (e.g., after data has been copied to a different location). Further, a program operation can be performed to write data to the block of memory cells.

Figure 4:
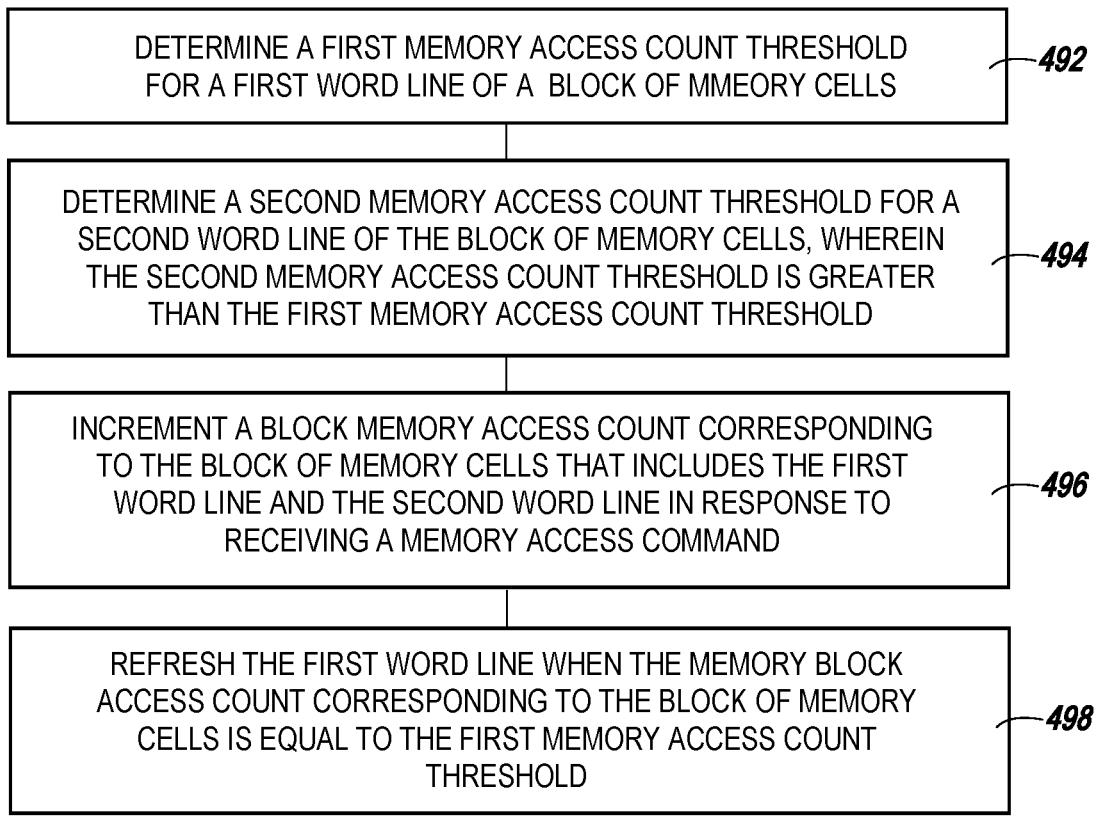
FIG. 4 is a flow diagram corresponding to a method for memory sub-system refresh in accordance with some embodiments of the present disclosure.

FIG. 4 is flow diagram corresponding to a method 490 for memory sub-system refresh in accordance with some embodiments of the present disclosure. The method 490 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 490 is performed by the refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 492, a first memory access count threshold for a first word line (e.g., one of the word lines 382, 383, 384, 385, 386, 387 illustrated in FIG. 3, herein) of a block of memory cells (e.g., the memory block 380 and/or the memory block 381 illustrated in FIG. 3, herein) can be determined. In some embodiments, the memory sub-system can be analogous to the memory sub-system 110 illustrated in FIG. 1. As described above, the memory components can be memory dice or memory packages that are coupled to one another to create an array of memory cells, such as a three-dimensional stackable cross-gridded array of memory cells used by the memory sub-system to store data.

At operation 494, a second memory access count threshold for a first word line of a block of memory cells can be determined. The second memory access count threshold can be greater than the first memory access count threshold. As mentioned, NAND characterization data, which can be determined and/or assigned by a NAND manufacturer for instance, can include a number of memory access count thresholds (e.g., the first memory access count threshold and the second memory access count threshold).

At operation 496, a memory block access count corresponding to the block of memory cells that includes the first word line and the second word line is incremented in response to receiving a memory access command. An example of a memory access command is a read command.

At operation 498, the first word line is refreshed when the memory block access count corresponding to the block of memory cells is equal to the first memory access count threshold. One or more embodiments provide that refreshing the first word line is refrained from when the memory block access count corresponding to the block of memory cells is less than the first memory access count threshold.

In some embodiments, the method 490 can include refreshing the second word line when the memory block access count corresponding to the block of memory cells is equal to the second memory access count threshold. One or more embodiments provide that refreshing the second word line is refrained from when the memory block access count corresponding to the block of memory cells is less than the second memory access count threshold.

In some embodiments, the method 490 can include resetting the block memory access count corresponding to the block of memory cells when the block memory access count corresponding to the block of memory cells is equal to the second memory access count threshold.

In some embodiments, the method 490 can include refreshing each word line of the block of memory cells when the memory block access count corresponding to the block of memory cells is equal to the second memory access count threshold.

Figure 5:
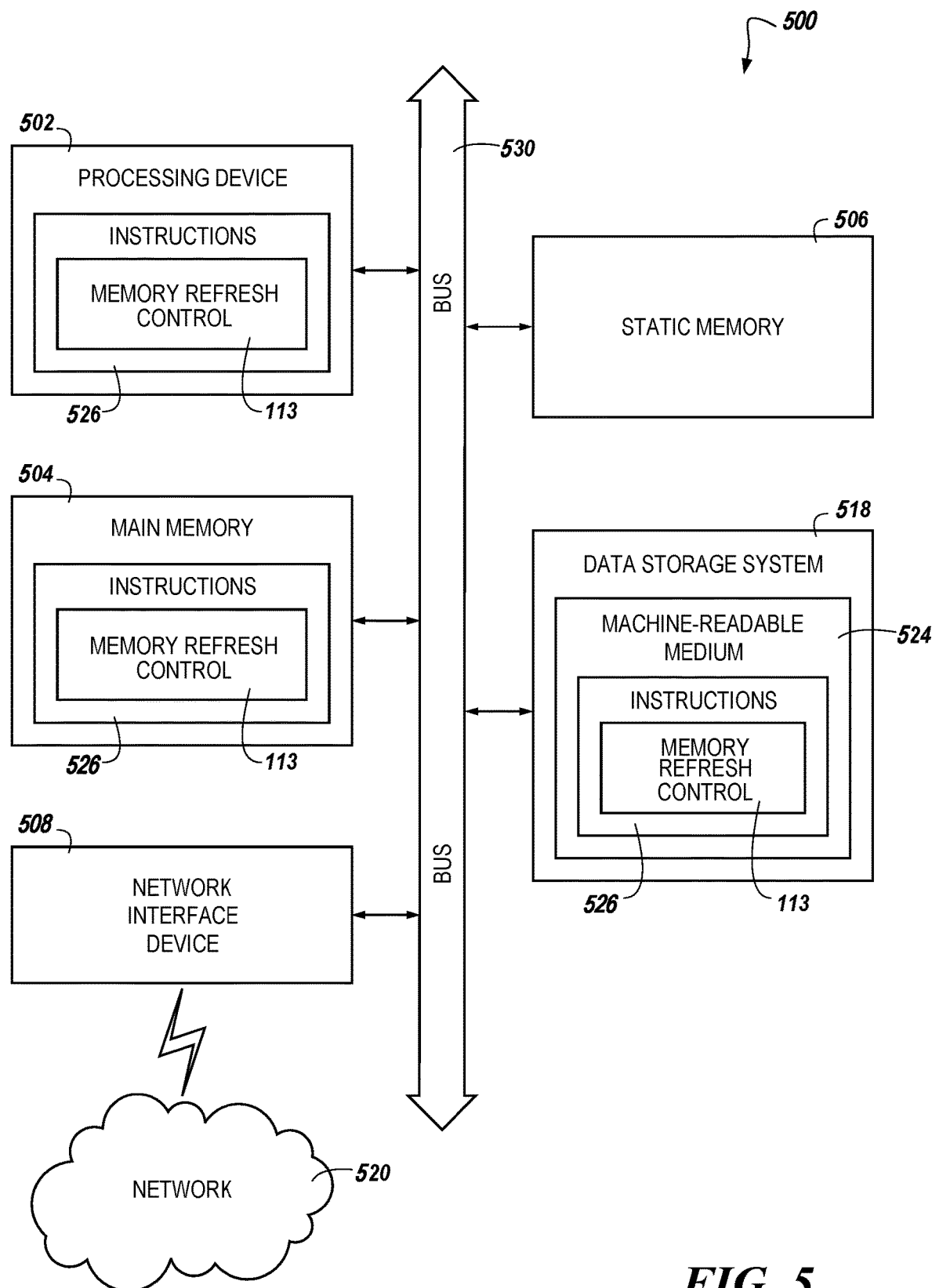
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the refresh component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a refresh component (e.g., the refresh component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   incrementing a memory block access count corresponding to a block of memory cells that includes a first word line and a second word line in response to receiving a memory access command, wherein the first word line is associated with a first memory access count threshold and the second word line is associated with a second memory access count threshold that is greater than the first memory access count threshold; and
   refreshing the second word line and resetting the memory block access count corresponding to the block of memory cells when the memory block access count corresponding to the block of memory cells is equal to the second memory access count threshold.

2. The method of claim 1, further comprising refreshing the first word line when the memory block access count corresponding to the block of memory cells is equal to the first memory access count threshold.

3. The method of claim 1, wherein further comprising refreshing each word line of the block of memory cells when the memory block access count corresponding to the block of memory cells is equal to the second memory access count threshold.

4. The method of claim 1, further comprising refraining from refreshing the first word line when the memory block access count corresponding to the block of memory cells is less than the first memory access count threshold.

5. The method of claim 1, further comprising refraining from refreshing the second word line when the memory block access count corresponding to the block of memory cells is less than the second memory access count threshold.

6. An apparatus, comprising:
   a block of memory cells comprising a first word line and a second word line; and a controller coupled to the block of memory cells, wherein the controller is configured to:
   refresh the first word line when a memory block access count corresponding to the block of memory cells is equal to a first memory access count threshold; and
   refresh the second word line when the memory block access count corresponding to the block of memory cells is equal to a second memory access count threshold, wherein the second memory access count threshold is greater than the first memory access count threshold.

7. The apparatus of claim 6, wherein the controller is configured to: increment the memory block access count corresponding to the block of memory cells in response to receiving a memory access command.

8. The apparatus of claim 6, wherein the apparatus comprises a mobile computing device.

9. The apparatus of claim 6, wherein the word line that is different than the first word line and the second word line is within a different block of memory cells.

10. The apparatus of claim 6, wherein the word line that is different than the first word line and the second word line is within the block of memory cells.

11. The apparatus of claim 6, wherein the controller is configured to: refresh the first word line when memory block access count to the block of memory cells is equal to the first memory access count threshold by copying data from the first word line to a word line that is different than the first word line and the second word line.

12. The apparatus of claim 11, wherein the data copied from the first word line to the word line that is different than the first word line and the second word line is not erased from the first word line prior to the second word line being refreshed.

13. A non-transitory computer-readable storage medium comprising instructions that, when executed by a processing device, cause the processing device to:
   refresh a first word line when a memory block access count is equal to a first read count threshold;
   refresh a second word line when the memory block access count is equal to a second read count threshold, wherein the second read count threshold is greater than the first read count threshold; and reset the memory block access count when the memory block access count is equal to the second read count threshold.

14. The medium of claim 13, wherein the first read count threshold and the second read count threshold are assigned by a manufacturer.

15. The medium of claim 13, wherein the first read count threshold and the second read count threshold are based at least in part on read disturb characterizations of the first word line or the second word line, or both.

16. The medium of claim 13, wherein the instructions are executable by the processing device to cause the processing device to: increment the memory block access count.

17. The medium of claim 13, wherein the increment to the memory block access count is in response to receiving a read command.

18. The medium of claim 17, wherein the instructions are executable by the processing device to cause the processing device to: erase the memory block when the memory block access count corresponding to the block of memory cells is equal to the second memory access count threshold.

19. The medium of claim 18, wherein the instructions are executable by the processing device to cause the processing device to: perform a program operation to write data to the memory block.

\* \* \* \* \*